United States Patent
Tritt et al.

(10) Patent No.: US 6,552,255 B1
(45) Date of Patent: Apr. 22, 2003

(54) THERMOELECTRIC COMPOSITION

(75) Inventors: Terry M. Tritt, Anderson, SC (US);
Roy L. Littleton, Clemson, SC (US);
Joseph Kolis, Central, SC (US);
Christopher Feger, Easley, SC (US)

(73) Assignee: Clemson University, Clemson, SC (US)

( * ) Notice: Subject to any disclaimer, the term of this patent is extended or adjusted under 35 U.S.C. 154(b) by 0 days.

(21) Appl. No.: 09/390,127

(22) Filed: Sep. 3, 1999

Related U.S. Application Data (60) Provisional application No. 60/098,955, filed on Sep. 3, 1998.

(51) Int. Cl.[7] ............................................. H01L 35/28
(52) U.S. Cl. .................... 136/203; 136/205; 136/236.1; 136/238; 136/239; 136/240
(58) Field of Search ................................. 136/203, 205, 136/238, 239, 240

(56) References Cited

PUBLICATIONS

Effect of Ti substitution on the Thermoelectric Properties of Pentatelluride Materials (M1–xTixTe5 (M= Hf, Zr), R. T. Littleton, IV, T.M. Tritt, C.R. Feger, J. Kolis, M.L. Wilson, M. marone, J. Payne, D. Verebeli, and F. Levy, Appl. Phys. Lett., 72, 2056–8, Apr. 1998.*

Effect of Antimony Doping on the Thermoelectric Properties of the Transition Metal Tentatellurides (Hf1–xZrxTe5–ySby), R.T. Littleton, IV, Terry M. Tritt, J.W. Kolis, M.C. Bryan, D.R. Ketchum, and J.J. McGee, 18th International Conference on thermoelectrics, Apr. 2000.*

Electrical Transport Properties of the Pentatelluride materials HFTE5 and ARTE5, T.M. Tritt, M.L. Wilson, R.L. Littleton, JR., C. Feger, J. Kolis, A. Johnston, D.T. Verbelyl, S.J. Hwu, M. Fakhruddin and F. Levy, Mat. Res. Sec. Symp. Proc. vol. 478, 249–254, Sep. 1997.*

Effect of Isoelectronic Substitution of Thermopower and Resistivity of Hf1–xZrxTe5, R.T. Littleton IV, M.L. Wilson, C.R. Feger, M.J. Maron, J. Kolis and T.M. Tritt, 16th International Conference on Thermoelectrics, 493–495, Oct. 1997.*

Jone, T.E., Fuller, W.W., Wieting, T.J., and Levy, F., "Thermoelectric Power of HfTe5 and ZrTe5", Solid State Communications, vol. 42, No. 11, Jan. 1992, pp. 793–798.*

Littleton, R.T., Wilson, M.L., Feger, R.C., Marone, M.J., Kolis, J., Tritt, T.M., and Levy, F., "Effect of Isoelectronic Substitution of Thermpower and Resistivity of Hf–1–xZrxTe5", 16th International Conference on Thermoelectrics, Aug. 1997, pp. 493–495.*

Tritt et al., Electrical Transport Properties of the Pentatelluride Materials HFTE5 and ZRTE5, presented at the Mat. Res. Soc. Symposium Mar. 31–Apr. 3, 1997.*

Abstract—"Electrical Transport Properties of the Polycrystalline Pentatelluride Materials HfTe$_5$ and ZrTe$_5$", Tritt, et al., p. 297, *Abstracts, MRS 1997 Spring Meeting*, 2 pages, Sep. 1997.

Abstract—"Thermoelectric Evaluation of Doped ZrTe$_5$ and HfTe$_5$ Compounds", Littleton, et al., p. 70, *Program &Abstracts XVI International Conference on Thermoelectrics*, 2 pages, Oct. 1997.

* cited by examiner

*Primary Examiner*—Nam Nguyen
*Assistant Examiner*—Thomas H Parsons
(74) *Attorney, Agent, or Firm*—Dority & Manning, P.A.

(57) ABSTRACT

The thermoelectric properties (resistivity, thermopower and thermal conductivity) of single crystals of the low-dimensional pentatelluride materials are disclosed. The pentatellurides are well suited for use in thermoelectric devices. In general, the pentatellurides include hafnium pentatelluride and zirconium pentatelluride, which can both be substituted with selective amounts of various metals, including titanium, selenium, and antimony.

34 Claims, 9 Drawing Sheets

THERMOELECTRIC COMPOSITION

This application claims the benefit of priority from U.S. Provisional Patent Application No. 60/098,955, filed Sep. 3, 1998.

BACKGROUND OF THE INVENTION

The present invention generally relates to thermoelectric compositions which can be used, for instance, to cool integrated circuit chips in various devices. More particularly, the present invention is directed to thermoelectric compositions comprising transition metal pentatellurides and transition metal chalcogenides.

Thermoelectricity, or the Seebeck effect, is the physical phenomenon used in thermocouples for temperature measurement: a voltage difference is measured for a specific temperature difference. Less common is the use of thermoelectric materials for use in electronic refrigeration or power generation. Recently, there has been a renewed interest in the field of thermoelectrics for these applications. This interest has been primarily driven by the need for new and higher performance thermoelectric materials.

Thermoelectric materials are simply low-power, miniature heat pumps that are small enough to be easily integrated into compact electrical systems. The materials operate under direct current minimizing electrical noise, and can be used for heating or cooling by reversing the direction of current flow.

Figure 1:
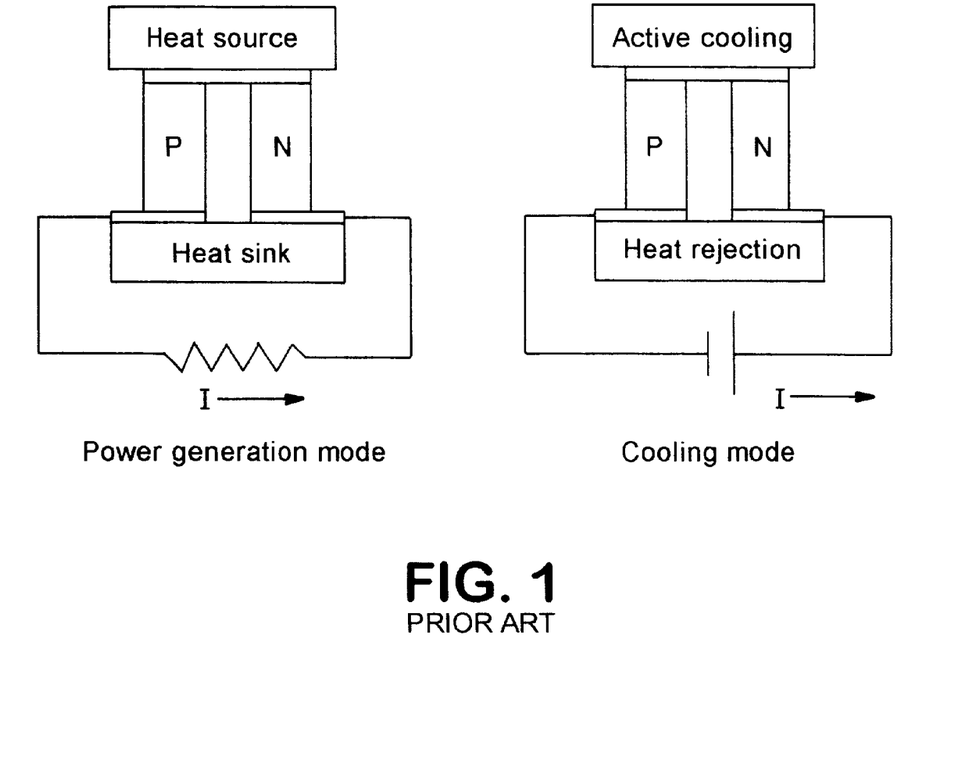
FIG. 1 is a diagram of a thermoelectric material as is generally known in the art.

Thermoelectric energy conversion utilizes the heat generated (as a result of the Peltier effect) when an electric current is passed through a thermoelectric material to provide a temperature gradient (see FIG. 1). Heat is absorbed on the cold side and rejected at the sink, thus providing a refrigeration capability. Conversely, an imposed temperature difference will result in a voltage or current, that is, power generation on a small scale.

During cooling applications, when a positive DC voltage is applied to the N-type material of the thermoelectric composition, electrons pass from the P-type material. Heat is then absorbed from the cold side of the material causing the temperature to decrease. This heat pumped from the cold side plus the heat generated by the input power is conducted through to the hot side of the composition, where it is dissipated by a heat sink. The degree of cooling achieved is typically proportional to the current and to the number of thermoelectric couples.

The advantages of thermoelectric solid-state energy conversion are compactness, quietness, (no moving parts), and localized heating or cooling. Some applications include cooling of CCDs (charge-coupled devices), infrared detectors, low-noise amplifiers, and computer chips. Such thermoelectric coolers are also very stable and can be used for temperature stabilization of laser diodes or electronic components. Given the harmful effect of standard chlorofluorocarbon and greenhouse refrigeration gases on the environment and the need for small-scale localized cooling in computers and electronics, the field of thermoelectrics is in need of higher performance room-temperature materials than those that currently exist. In addition, as the field of cryoelectronics (utilizing high-transition temperature superconducting electronics) develops, the need for lower temperature (100 to 200 K) and higher performance thermoelectric materials is becoming more prevalent.

Thermoelectric materials are also being considered in the automobile industry for use in the "next-generation vehicle." Possible uses range from power generation using waste engine heat to seat coolers for comfort or electronic component cooling.

In view of the above, currently, a need exists for new thermoelectric materials for small-scale localized cooling. In particular, a need exists for materials that are more efficient than conventional compositions.

SUMMARY OF THE INVENTION

The present invention recognizes and addresses the foregoing disadvantages, and others of prior art constructions and methods.

Accordingly, it is an object of the present invention to provide thermoelectric compositions for use in thermoelectric devices.

Another object of the present invention is to provide an improved thermoelectric device.

These and other objects of the present invention are achieved by providing a thermoelectric device comprising a thermoelectric composition. According to the present invention, the thermoelectric composition is a pentatelluride. For instance, the pentatelluride can be hafnium pentatelluride or zirconium pentatelluride. Further, the pentatelluride can be doped with various elements, including titanium, selenium, antimony, and mixtures thereof.

In one embodiment, the pentatelluride of the present invention has the following formula:

$$M_{1-x}Y_xTe_5$$

wherein

X is from 0 to 1

M is Hf or Zr

Y is Ti, Se or Sb.

As described above, the pentatellurides of the present invention can be incorporated into various thermoelectric devices. For most applications, the thermoelectric devices will include a power source for generating a current through the thermoelectric composition. The power source can generate, for instance, a positive DC voltage. The thermoelectric device can be used in many various and different applications.

Other objects, features and aspects of the present invention are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference the accompanying figures, in which.

FIG. (2b) is a graph of the absolute thermopower, α, as a function of temperature for single crystal HfTe5 and Hf0.95Ti0.05Te5.

FIG. (3a) is a graph the resistivity, ρ, as a function of temperature for single crystal ZrTe5 and Zr0.90Ti0.1Te5, FIG. (3b) is graph of the absolute thermopower, α, as a function of temperature for single crystal ZrTe5 and Zr0.90Ti0.1Te5.

Repeat use of reference characters in the present specification and drawings is intended to represent same or analogous features of elements of the invention.

DETAILED DESCRIPTION OF PREFERRED EMBODIMENTS

It is to be understood by one or ordinary skill in the art that the present discussion is a description of exemplary embodiments only, and is not intended as limiting the broader aspects of the present invention, which broader aspects are embodied in the exemplary constructions.

The present invention is directed to new and/or significantly more efficient thermoelectric (TE) materials, driven by the need for much higher performance and new temperature regimes for thermoelectric devices in many applications. These applications which utilize thermoelectric materials are demanding higher performance room temperature materials than exist presently. The need for lower temperature (T<200 K) is especially acute, where for example, lower temperature thermoelectric cooling packaging for HgCdTe infrared detectors could provide increased sensitivity and faster response than current technology for thermal sensing. In addition, as the field of "cryoelectronics" and "cold computing" grows the need for lower temperature (100–200 K) thermoelectric materials will become necessary. For example, a severe limitation to cellular phone communications technology using superconducting narrow-band spectrum dividers to increase frequency band utilization is a reliable-low-maintenance cooling and refrigeration technology.

Thermoelectric energy conversion utilizes the Peltier heat generated when an electric current is passed through a thermoelectric material to provide a temperature gradient with heat being absorbed on the cold side and rejected at the sink, thus providing a refrigeration capability. Conversely, an imposed ΔT will result in a voltage or current, i.e. small scale power generation. For a material to be a good candidate for thermoelectric applications it needs to possess a high figure of merit, Z, where $ZT=\alpha^2\sigma T/\lambda$, where $\alpha$ is the Seebeck coefficient, $\sigma$ the electrical conductivity and $\lambda$ the total thermal conductivity ($\lambda = \lambda_L + \lambda_E$; the lattice and electronic contributions respectively). Materials of both n-type and p-type are necessary if a thermoelectric device is to be fabricated. The most promising materials are typically semiconductors with carrier concentrations of approximately $10^{19}$ carriers/cm$^3$. The power factor, $\alpha^2\sigma$, can be optimized through doping to give the largest Z. High mobility carriers are most desirable so as to have the highest electrical conductivity. The current state of the art materials typically possess a ZT approximately equal to one at their peak application or operating temperature.

Many new materials, new classes of compounds and new synthesis techniques are being investigated and some of these are showing promising results, however most of the results are in relation to higher temperature applications. With respect to the low temperature materials, a candidate material might be one which exhibits a sharp density of states (n(E)) near the Fermi energy ($E_F$) that could lead to a large thermoelectric power. The electrical conductivity is proportional to n(E) while the thermopower is proportional to the logarithmic derivative of n(E) ((1/n)*dn/dE) with E evaluated at E=$E_F$. Low-dimensional systems are known to be very susceptible to van Hove singularities (or cusps) in their density of states. A number of systems that are candidates for such low temperature thermoelectric materials are heavy fermion materials, Kondo systems and low-dimensional materials. Low dimensional materials are specifically susceptible to electronic phase transitions and exotic transport properties. Doping exhibits typically very strong effects in these types of materials and can drastically change their electronic transport. Quantum well systems take advantage of this low dimensional character through physical confinement in thin film structures to enhance the electronic properties of the material (i. e. the power factor, $\alpha^2\sigma$).

The present invention is generally directed to the use of transition metal pentatellurides and the use of transition metal chalcogenides in thermoelectric applications. The present invention is also directed to the effect of titanium, sellenium, and antimony substitution on the thermoelectric properties of the above thermoelectric materials for their use in low temperature thermoelectric applications. Besides the above substitutions, the present invention is also directed to other metal substitutions.

Processes for making the pentatellurides of the present invention have been described previously in various publications. Information on their availability can be obtained from Clemson University in Clemson, S.C.

As described above, the pentatellurides of the present invention are well suited for use in thermoelectric applications. For instance, the materials can be used in various thermoelectric devices, such as charge-coupled devices, infrared detectors, low noise amplifiers, and computer chips. Examples of thermoelectric devices that can include the materials of the present invention are described in U.S. Pat. No. 5,171,372 to Recine. Sr. and U.S. Pat. No. 5,737,923 to Gilley. et al., which are incorporated herein by reference in their entireties. Various uses of the materials of the present invention are also described in the following articles: Electrical Transport Properties of the Pentatelluride Materials $HFTE_5$ and $ZRTE_5$, *Mat. Res. Soc. Symp. Pro.,* Volume 478, 1997; Effect of Isoelectronic Substitution of Thermopower and Resistivity of $Hf_{1-x}Zr_xTe_5$, *Applied Physics Letters,* Volume 72, No. 16, Apr. 20, 1998; and Effect of Ti Substitution on the Thermoelectric Properties of the Pentatelluride Materials $M_{1-x}Ti_xTe_5$ (M=Hf, Zr), *International Conference on Thermoelectrics,* 1997, which are all incorporated herein by reference in their entireties.

Figure 2A:
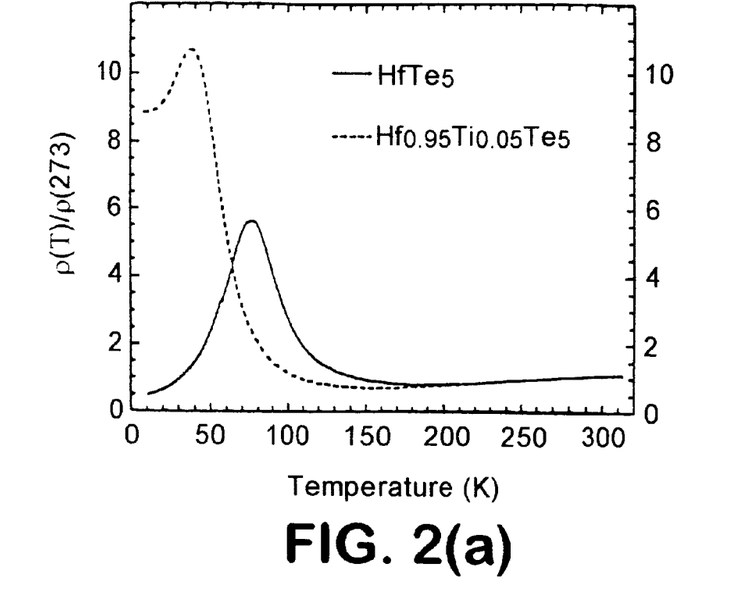
FIG. 2(a) is a graph of the resistivity, ρ, as a function of temperature for single crystal HfTe5 and Hf0.95Ti0.05Te5.
Figure 2B:
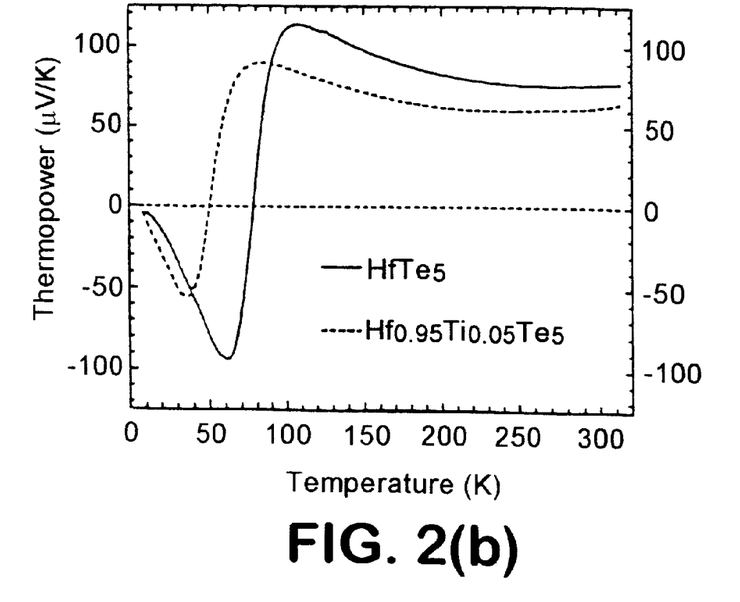
Figure 3A:
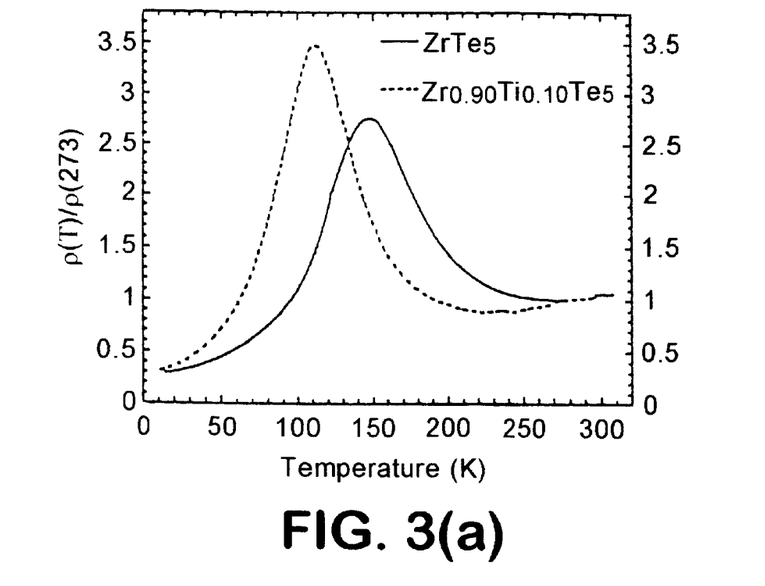
Figure 3B:
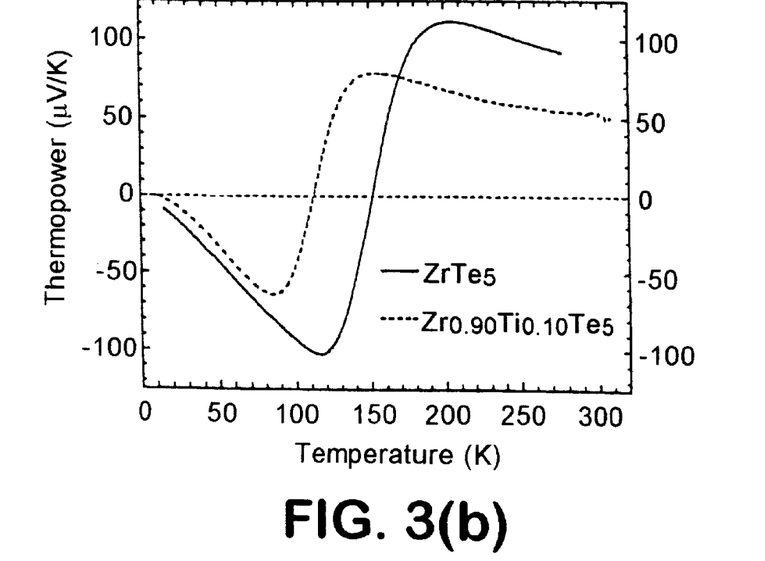

The materials of the present invention are low-dimensional materials known as the pentatellurides, $HfTe_5$ and $ZrTe_5$, which are well suited for use as a low temperature thermoelectric material. Referring to FIGS. 2 and 3, the resistivity and thermopower respectively for the undoped $HfTe_5$ and $ZrTe_5$ as a function of temperature are shown. This is data for a bundle of single crystal fibers, approximately 100 μm in diameter and approximately 5 mm long. As seen in FIG. 2a. the resistivity for $HfTe_5$ increases as the temperature is decreased from room temperature and exhibits a peak at around Tp≈80 K after which the resistivity falls rapidly as the temperature is further reduced. The resistivity at the peak is approximately three times the resistivity at room temperature.

The $ZrTe_5$ material behaves in a similar manner except that the peak occurs at a higher temperature, Tp≈145 K.

The room temperature electrical conductivity of these materials is $2.9\times10^3$ (½–cm)$^{-1}$ for $HfTe_5$ and $1\times10^3$ (½–cm)$^{-1}$ for $ZrTe_5$. However, the most interesting property of these materials, in relation to their potential for use as a thermoelectric material, concerns the low temperature (50–200 K) thermopower. At temperatures above the peak, the thermopower is very high, on the order of 120 $\mu$V/K for HfTe$_5$ and 110 $\mu$V/K for ZrTe$_5$, both of which are p-type. Near Tp, the thermopower exhibits a strong temperature dependence and changes sign to a comparable negative thermopower (Å −100 $\mu$V/K for each). Therefore, these materials exhibit thermopower that is relatively large over a broad temperature range and can have either sign: exhibiting n-type (T< Tp) and p-type (T>Tp) behavior depending on the temperature.

The transition or peak was first thought to be evidence of a charge density wave (CDW) peak but no evidence of a CDW transition or CDW behavior was found. The transition in the pentatellurides appears to be an electronic phase transition and not a structural phase transition, thus the electronic properties of this system are well suited to doping. In this regard, Zr and Ti was substituted for Hf in the HfTe$_5$ material. The doping and substitutions were able to change the peak temperature, while also affecting the magnitude of the resistivity of these materials. The magnitude of the thermopower has been found to be very sample dependent, probably due to small amounts of trace impurities or differences in growth conditions, so in doped materials the electronic properties can be optimized as desired.

Dramatic pressure effects have also been observed in the pentatelluride materials with the thermopower below the peak, the n-type, being changed by 150% or more to values of approximately −240 $\mu$V/K in ZrTe$_5$ at T=120 K and P=12 kbar. The resistivity (conductivity) is reduced (increased) by a factor of four at these pressures and temperatures. The thermopower, as well as the conductivity, for ZrTe$_5$ is increased with pressure, effectively increasing the power factor for this material by a factor of ten or more at these pressures and temperatures. Smaller changes, yet still substantial, are also observed in HfTe$_5$ at similar pressures.

These materials are also very sensitive to external stress. Uniaxial stress shifts the peak in resistance for ZrTe$_5$ and effects a change in magnitude more strongly in HfTe$_5$. Thus, the possibility of dramatically changing the thermopower towards more desirable values has already been shown to be possible. A very sharp variation of the density of states (n(E)) near the Fermi energy (E$_F$) is predicted from a calculation of the density of states for one of these materials, ZrTe$_5$. As discussed previously, this provides the possibility for a large thermoelectric power through various dopings to manipulate the Fermi level in these materials. A similar density of states exists for the HfTe$_5$ system.

The effect of isoelectronic substitution of Zr for Hf (Hf$_{1-x}$Zr$_x$Te$_5$) has also been explored. Depending on the Hf and Zr concentration, the peak temperature could be systematically shifted between the two parent materials, i. e. for the compound designation of Hf$_1$XZr$_x$Tr$_5$ the peak temperature shifted from 80 K for x=0 to 145 K for x=1. Here we found very good agreement with Tp and T($\alpha$=0), each being shifted systematically with concentration and in relative agreement with each other.

In an alternative embodiment, the present invention is directed to substituting a small amount of Ti for the transition metal atoms, Hf and Zr. The Ti atoms are substantially smaller than either Hf or Zr and should produce some effect of pressure within the system. The substitution is isoelectronic, as with the Hf and Zr; and Ti sits above both Hf and Zr in Column IV-B of the periodic table, each having 4 valence electrons in their respective d states. In FIG. 2(a) and 2(b) the resistivity and thermopower respectively is shown for the HfTe$_5$ and Hf$_{0.95}$Ti$_{0.05}$Te$_5$ materials. This small amount of Ti substitution (5%) shifts the peak temperature substantially from 80 K for HfTe$_5$ to Tp=38 K for Hf$_{0.95}$Ti$_{0.05}$Te$_5$, but in contrast to previous results the zero crossing of thermopower, T($\alpha$=0), occurred at much higher temperatures, T($\alpha$=0)=50 K. Also a high resistance state appears to subsist below the peak in contrast to all the other materials, where in all the other materials we have discussed, a very metallic behavior is evident below Tp.

In FIG. 3(a) and 3(b), the resistivity and thermopower respectively are shown for the ZrTe$_5$ and Zr$_{0.90}$Ti$_{0.1}$Te$_5$ materials. A Ti substitution of 10% for Zr shifts the peak temperature from 145 K for ZrTe$_5$ to Tp=110 K for Zr$_{0.9}$Ti$_{0.1}$Te$_5$, and the zero crossing of thermopower, T($\alpha$=0), occurs at approximately the same temperature in agreement with the behavior for the Hf$_1$XZr$_x$Tr$_5$ substitution reported previously. The metallic behavior is evident below T$_P$. Thus, with the substitutional doping of Ti for either Hf or Zr, it has been possible to systematically vary the peak temperature from 38 K to 145 K in this system, while maintaining the relatively large values of thermopower to these low temperatures. This has very strong ramifications on the use of these materials for low temperature thermoelectric applications.

The crystal structure is very complex for these materials, with a large number of atoms per unit cell. This coupled with the low-dimensional nature of the materials makes the material likely to have a relatively low thermal conductivity. The thermal conductivity of this system of materials has been measured, and found to be on the order of 5 watts/m-K for the HfTe$_5$ and ZrTe$_5$ materials and somewhat lower ($\approx$2 watts/m-K ) for the Ti doped materials. These are very promising values for the thermal conductivity and add to the potential of these materials. A TE module is typically composed of an n-type and a p-type material connected through electrical contact pads. At lower temperatures (T<90 K) a superconductor could be used as one leg, however not for heat transport but to return the current to other leg without joule heating. These pentatelluride materials, depending on temperature, as shown, exhibit both n-type and p-type behavior.

Referring now to FIGS. 4–9, various other tests are illustrated which were conducted on various materials made in accordance with the present invention. In particular, FIGS. 4–9 are graphs illustrating the resistivity and thermopower of various thermoelectric materials as the temperature is varied.

Figure 4:
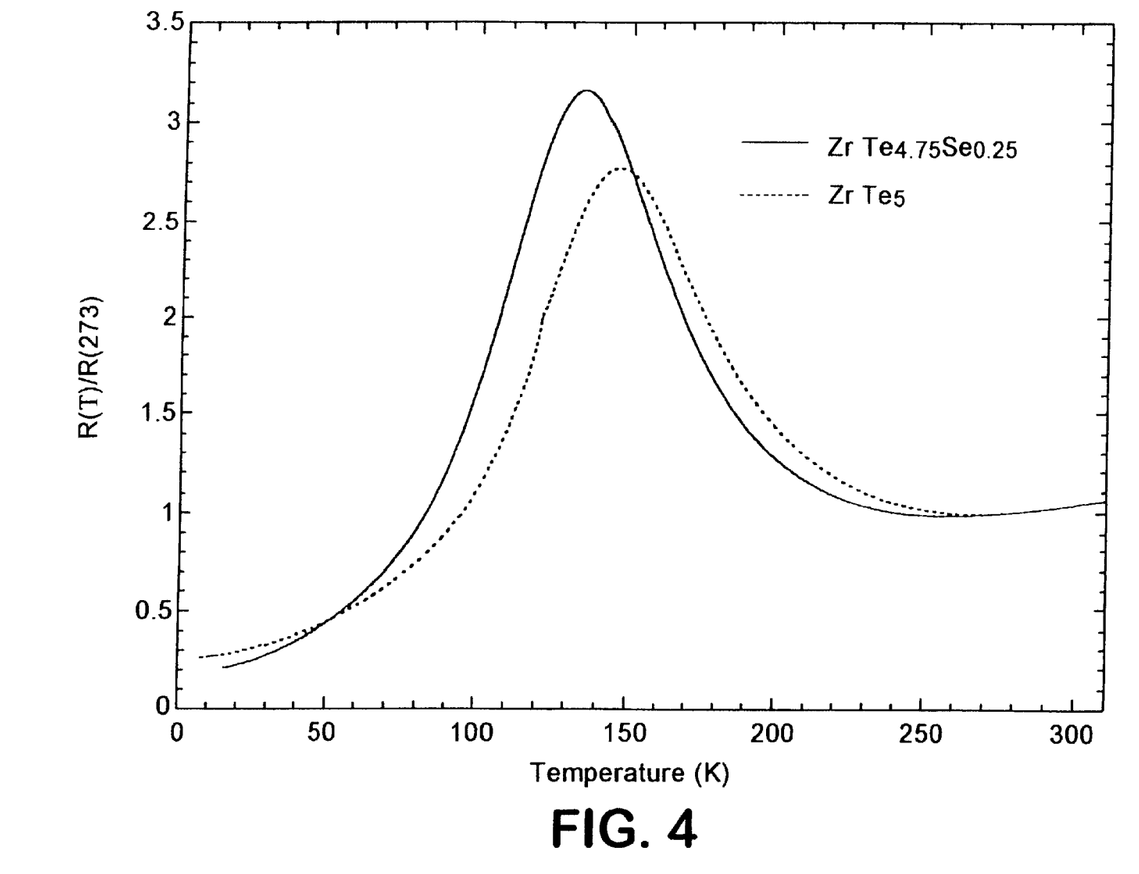
FIGS. 4–9 are directed to further tests done on materials made in accordance with the present invention where resistivity as a function of temperature and the absolute thermopower as a function of temperature were measured.
Figure 5:
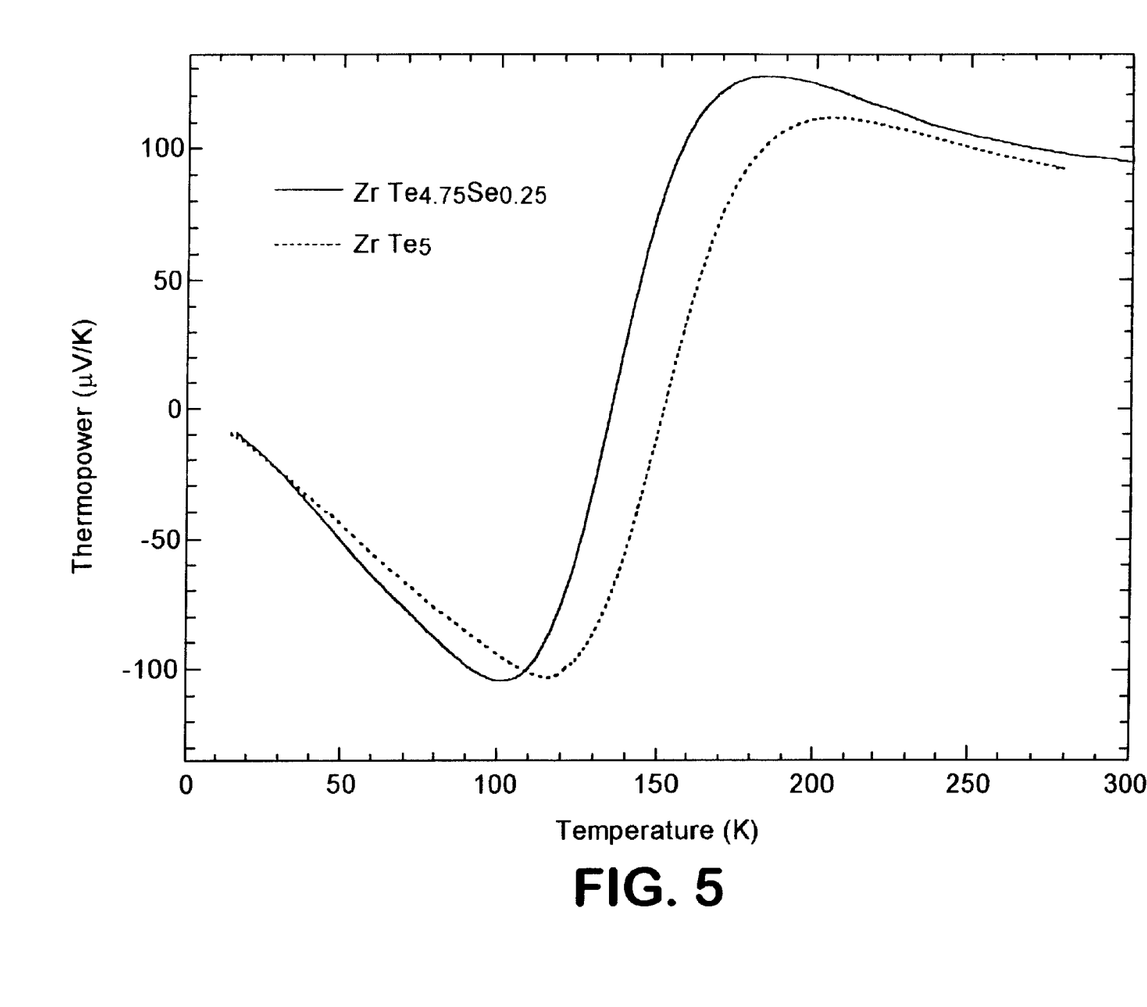

FIGS. 4 and 5 illustrate the effects selenium substitution for telluride has on resistivity and thermopower over a lower temperature range.

Figure 6:
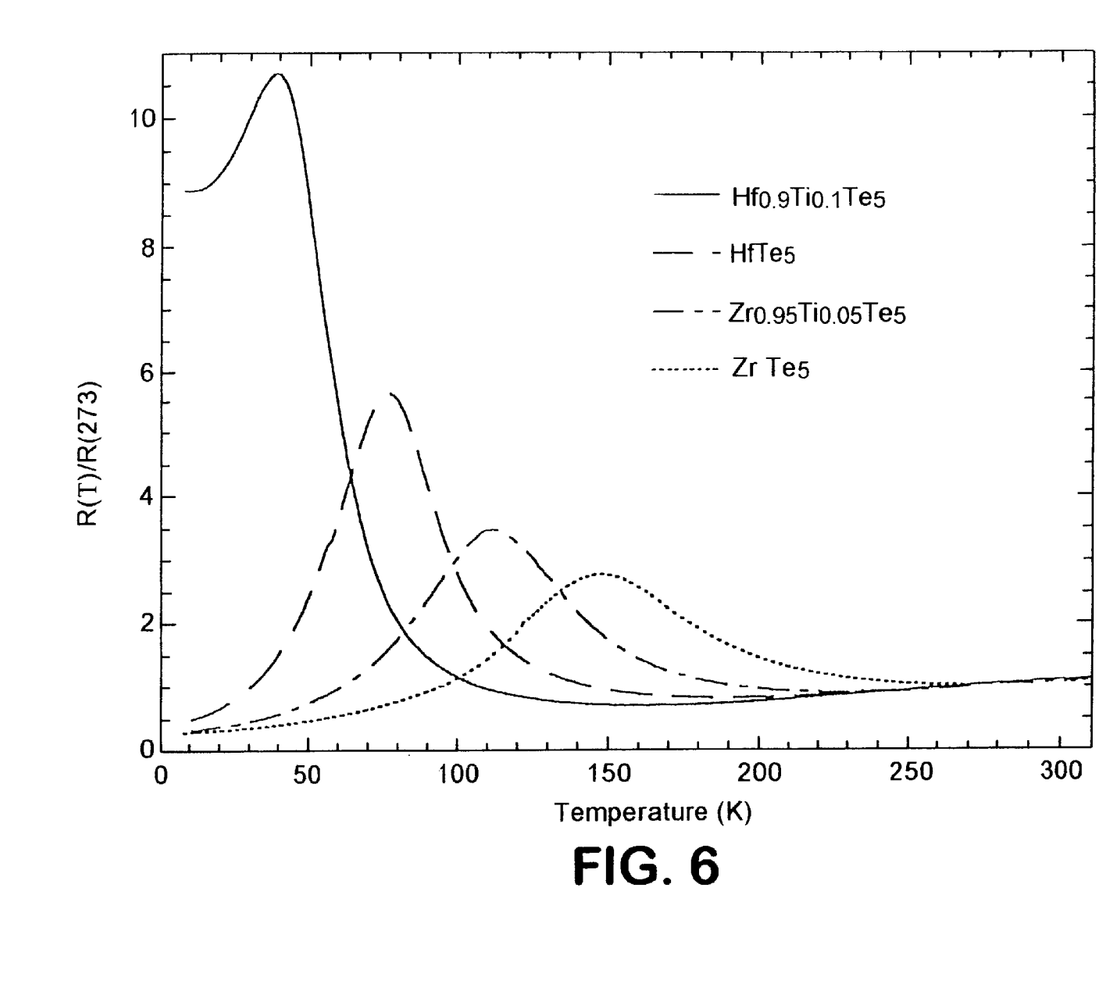
Figure 7:
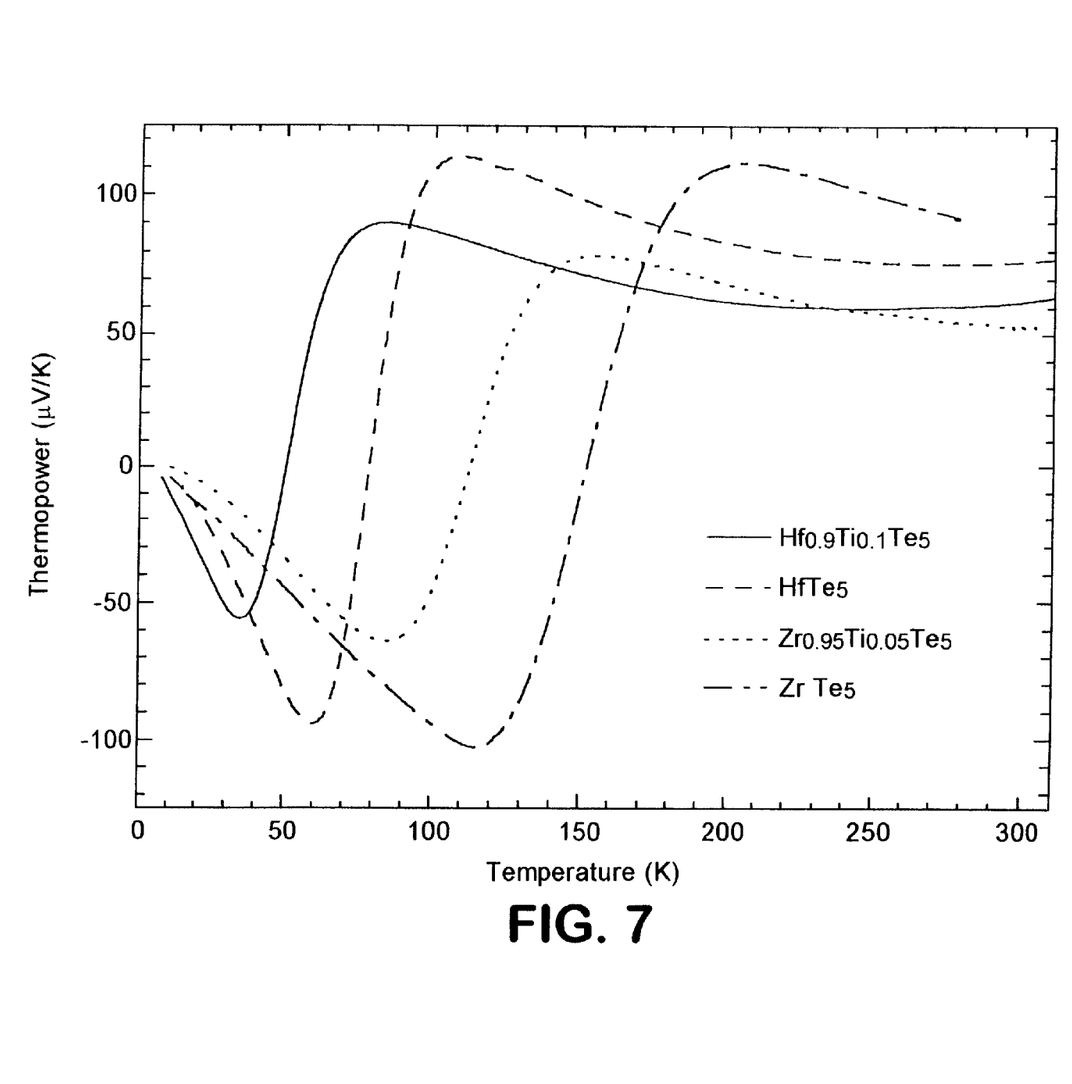

FIGS. 6 and 7 illustrate the effects titanium substitution has on the resistivity and thermopower of pentatelluride materials.

Figure 8:
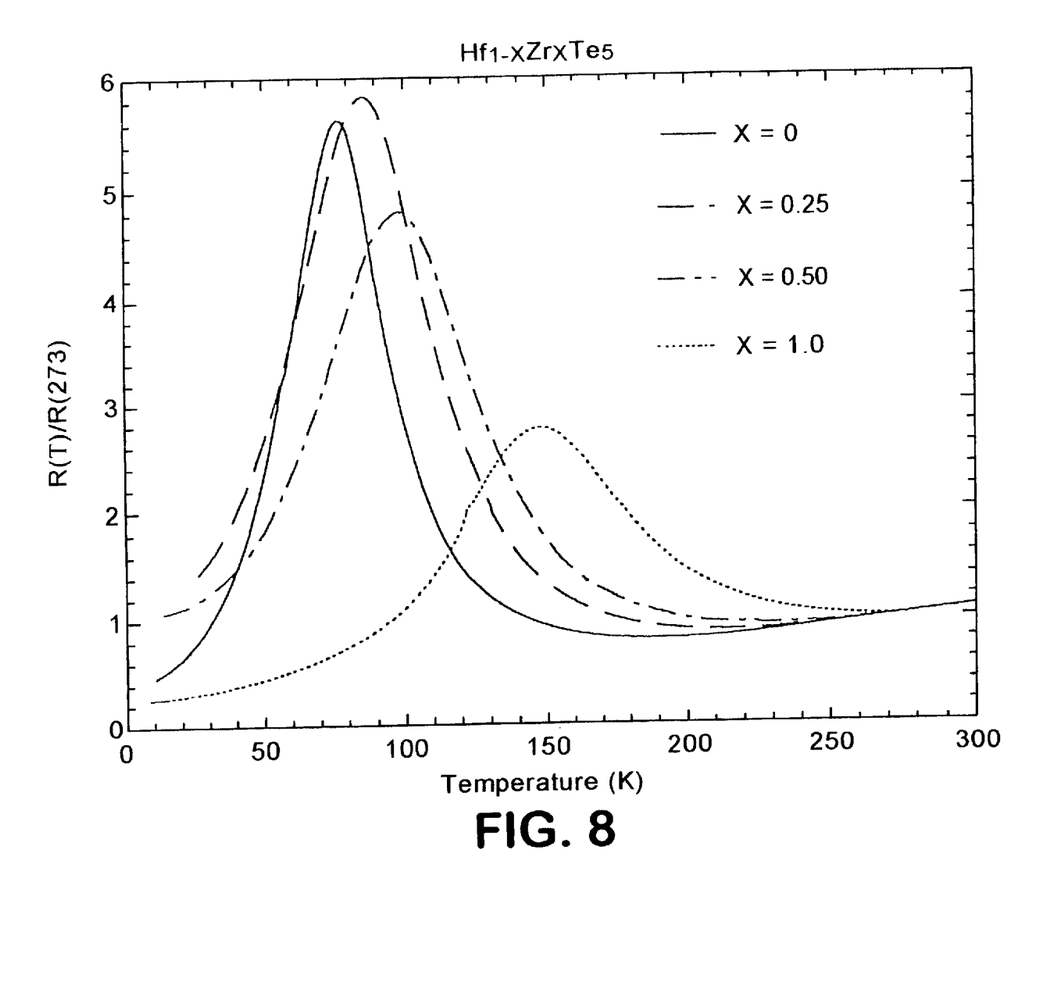
Figure 9:
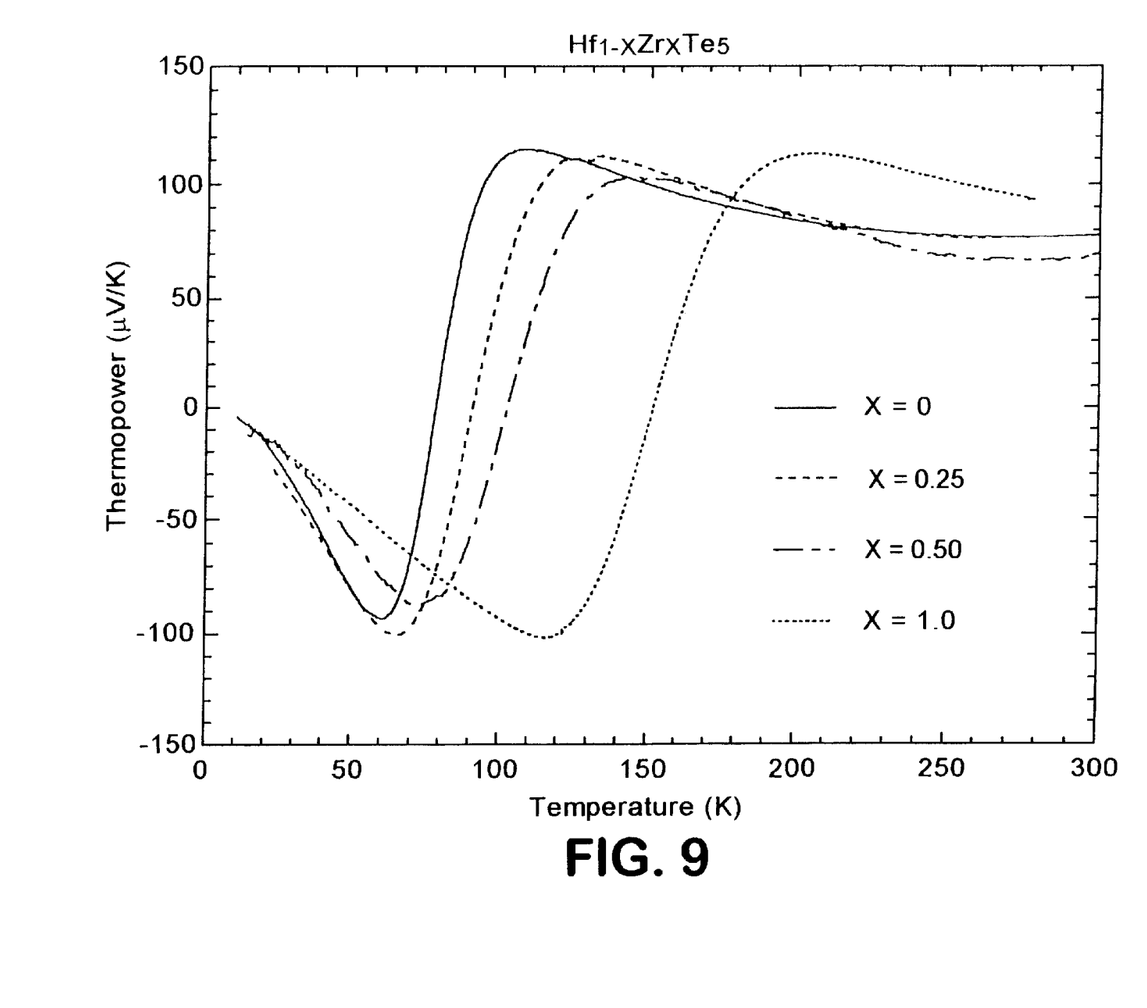

FIGS. 8 and 9, on the other hand, illustrate the resistivity and thermopower of varying the amount of zirconium in relation to hafnium in pentatelluride materials.

As shown from these figures, thermoelectric materials made in accordance with the present invention are not only well adapted to lower temperature applications, but, by varying different components within the materials, can operate over broader temperature ranges.

In summary, the present inventors have developed materials having lower temperature thermoelectric properties. Substitutional doping of Ti for either Hf or Zr, results in the peak temperature varying form 38 K to 145 K in this system, while maintaining the relatively large values of thermopower ($\approx$100 $\mu$V/K) to these low temperatures. This system of materials is well suited for use in low temperature thermoelectric devices.

These and other modifications and variations to the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention.

What is claimed is:

1. A thermoelectric device comprising a thermoelectric composition, said thermoelectric composition comprising a pentatelluride, wherein said thermoelectric device is configured to function in an application selected from the group consisting of heating applications, cooling applications, and power generation applications.

2. A thermoelectric device as defined in claim 1, wherein said pentatelluride comprises a hafnium pentatelluride.

3. A thermoelectric composition as defined in claim 1, wherein said pentatelluride comprises a zirconium pentatelluride.

4. A thermoelectric composition as defined in claim 2, wherein said pentatelluride is doped with a material selected from the group consisting of titanium, selenium, antimony and mixtures thereof.

5. A thermoelectric composition as defined in claim 3, wherein said pentatelluride is doped with a material selected from the group consisting of titanium, selenium, antimony and mixtures thereof.

6. A thermoelectric composition as defined in claim 1, wherein said pentatelluride is as follows:

$$M_1 x Y_x Te_5$$

wherein
X is from 0 to 1
M is Hf or Zr when X is less than one
Y is Ti, Se or Sb when X is greater than zero.

7. A thermoelectric device as defined in claim 6, wherein X is greater than zero and Y is titanium.

8. A thermoelectric device as defined in claim 6, wherein said X is greater than zero and Y is selenium.

9. A thermoelectric device as defined in claim 6, wherein said X is greater than zero and Y is antimony.

10. A thermoelectric device comprising:
a power source for generating an electrical current;
a thermoelectric composition in communication with said power source, said thermoelectric composition comprising a pentatelluride; and
wherein said thermoelectric device is configured to function in heating and cooling applications.

11. A thermoelectric composition as defined in claim 10, wherein said pentatelluride comprises:

$$M_1 x Y_x Te_5$$

wherein
X is from 0 to 1
M is Hf or Zr when X is less than one
Y is Ti, Se or Sb when X is greater than zero.

12. A thermoelectric device as defined in claim 11, wherein X is greater than zero and Y is titanium.

13. A thermoelectric device as defined in claim 11, wherein X is greater than zero and said Y is selenium.

14. A thermoelectric device as defined in claim 11, Wherein X is greater than zero and said Y is antimony.

15. A thermoelectric device as defined in claim 10, wherein said power source generates a positive DC voltage.

16. A thermoelectric device comprising:
a power source for generating an electrical current; and
a thermoelectric composition in communication with said power source, wherein said thermoelectric device is configured to function in heating and cooling applications, said thermoelectric composition comprising:

$$M_1 x Y_x Te_5$$

wherein
X is from 0 to 1
M is Hf or Zr when X is less than one
Y is Ti, Se or Sb when X is greater than zero.

17. A thermoelectric device as defined in claim 16, wherein M is hafnium.

18. A thermoelectric device as defined in claim 17, wherein X is greater than zero and Y is titanium.

19. A thermoelectric device as defined in claim 17, wherein X is greater than zero and said Y is selenium.

20. A thermoelectric device as defined in claim 17, wherein X is greater than zero and said Y is antimony.

21. A thermoelectric device as defined in claim 16, wherein M is zirconium.

22. A thermoelectric device as defined in claim 21, wherein X is greater than zero and Y is titanium.

23. A thermoelectric device as defined in claim 21, wherein X is greater than zero and said Y is selenium.

24. A thermoelectric device as defined in claim 21, wherein X is greater than zero and said Y is antimony.

25. A thermoelectric device comprising a thermoelectric composition, said thermoelectric composition comprising a doped pentatelluride.

26. A thermoelectric device as defined in claim 25, wherein said doped pentatelluride comprises a doped hafnium pentatelluride.

27. A thermoelectric device as defined in claim 26, wherein said doped hafnium pentatelluride is doped with a material selected from the group consisting of titanium, selenium, antimony, zirconium, and mixtures thereof.

28. A thermoelectric device as defined in claim 25, wherein said doped pentatelluride comprises a doped zirconium pentatelluride.

29. A thermoelectric device as defined in claim 28, wherein said doped zirconium pentatelluride is doped with a material selected from the group consisting of titanium, selenium, antimony and mixtures thereof.

30. A thermoelectric device as defined in claim 25, wherein said doped pentatelluride is as follows:

$$M_1 x Y_x Te_5$$

wherein
X is greater than 0 and X is less than 1,
M is Hf or Zr,
Y is Ti, Se or Sb.

31. A thermoelectric device as defined in claim 30, wherein Y is titanium.

32. A thermoelectric device as defined in claim 30, wherein said Y is selenium.

33. A thermoelectric device as defined in claim 30, wherein said Y is antimony.

34. A thermoelectric device as defined in claim 25, wherein said device is configured to function in an application selected from the group consisting of heating and cooling applications, power generation applications, and thermal sensing applications.

* * * * *

UNITED STATES PATENT AND TRADEMARK OFFICE
CERTIFICATE OF CORRECTION

PATENT NO.    : 6,552,255 B1
DATED         : April 22, 2003
INVENTOR(S)   : Terry M Tritt et al.

It is certified that error appears in the above-identified patent and that said Letters Patent is hereby corrected as shown below:

Column 8,
Line 50, please correct claim 30 equation to read as follows:
-- $M_{1-x} Y_x Te_5$ --

Signed and Sealed this

Fourteenth Day of October, 2003

JAMES E. ROGAN
*Director of the United States Patent and Trademark Office*